United States Patent [19]
Jewett

[11] Patent Number: 6,156,667
[45] Date of Patent: Dec. 5, 2000

[54] METHODS AND APPARATUS FOR PLASMA PROCESSING

[75] Inventor: Russell F. Jewett, Charlotte, N.C.

[73] Assignee: Litmas, Inc., Matthews, N.C.

[21] Appl. No.: 09/490,496

[22] Filed: Jan. 24, 2000

Related U.S. Application Data

[60] Provisional application No. 60/174,110, Dec. 31, 1999.
[51] Int. Cl.$^7$ ..................................................... H01L 21/00
[52] U.S. Cl. ........................ 438/715; 156/345; 438/714; 438/729
[58] Field of Search ........................... 438/710, 711–714, 438/715, 729; 156/345 P, 345 PH

[56] References Cited

U.S. PATENT DOCUMENTS 4,971,653  11/1990  Powell et al. ........................ 438/715 X

*Primary Examiner*—William Powell
*Attorney, Agent, or Firm*—Larry Williams

[57] ABSTRACT

The reliability of a plasma processing chamber has been increased using a heat moderating material to facilitate controlling heat removal from dielectric parts of the plasma chamber. The heat moderating material performs at least one of the functions: moderating heat transfer rate and functioning as a heat spreader. The heat moderating material allows removal of heat from the dielectric so that the dielectric maintains temperatures that result in negligible corrosion to the dielectric and the dielectric maintains temperature gradients that minimize thermal stress induced breakage of the dielectric.

22 Claims, 4 Drawing Sheets

METHODS AND APPARATUS FOR PLASMA PROCESSING

CROSS-REFERENCES

The present application is related to U.S. patent application Ser. No. 09/476,020, filed on Dec. 31, 1999, and U.S. Provisional Patent Application Ser. No. 60/174,110, entitled "Methods and Apparatus for Process Operations with RF Power" by Russell F. Jewett and Curtis C. Camus filed on Dec. 31, 1999. All of these applications are incorporated herein by this reference.

BACKGROUND

This invention relates to improved methods and apparatus for plasma processing.

Plasmas are used in a wide variety of applications for carrying out process operations. Exemplary of such process operations is the use of RF induction power to produce non-thermal plasmas, also referred to as non-equilibrium plasmas. The manufacture of semiconductor devices is one area in which non-thermal plasmas are used extensively. The non-thermal plasmas are used for etch processes wherein the non-thermal plasmas are used to generate reactive species in a gas to accelerate reactions between the species and a solid surface. The etch process can be a general removal of components on the surface as in a cleaning process or the selective removal of material from certain areas on the surface through use of a masking material that has been previously patterned. Non-thermal plasmas are used to promote deposition reactions wherein gas phase species are caused to react to form a solid product that deposits on surfaces. During the manufacture of semiconductor devices, etch processes involving RF plasmas and deposition processes involving RF plasmas are used repeatedly during the fabrication process. One of the main benefits of using the non-thermal plasma is the ability of the non-thermal plasma to stimulate chemical reactions that would otherwise require temperatures that are too high for use in the fabrication of semiconductor devices.

RF power non-thermal plasmas are also used as cleaning processes in manufacture of semiconductor devices. The non-thermal plasmas are commonly used to strip photoresist materials from semiconductor wafers as part of post etch wafer clean procedures. The photoresist material serves as a mask material during etch processes used in patterning the surface of the devices. Resist material is stripped from the surface of the wafers by creating a non-thermal plasma in a gas containing oxidizing species such as oxygen and possibly halogen species that are capable of reacting with and volatilizing the resist material. In some applications, the non-thermal plasma is maintained at a position upstream of the wafer. Reactive species generated in the non-thermal plasma flow downstream and react with the wafer surface for the stripping process.

Another cleaning process that uses non-thermal plasmas is the cleaning of reaction chambers used in semiconductor manufacturing. Sometimes, the reaction chambers used in plasma etch processes experience a buildup of deposits from the etch process. These deposits need to be removed as part of the reactor maintenance process. In addition, the reactors that are used in deposition processes for semiconductor device fabrication undergo a buildup of deposits on the reactor walls; the wall deposit must be removed as part of reactor maintenance. Non-thermal plasmas generated using RF power and gases containing species that are reactive with the deposits have been used to volatilize and removed the deposits built up on the walls of etch reactors and deposition reactors.

RF power plasmas have also been used for decomposition of chemical compounds that are hazardous or otherwise undesirable. Some of the compounds are highly refractory in nature and are difficult to decompose. Examples of compounds that have been decomposed or abated with plasmas include chlorofluorocarbons (CFC) and perfluorocompounds (PFC).

For some applications, there are major problems with the methods and apparatus used for carrying out plasma processes. One set of problems is related to incompatibilities between design requirements for the apparatus and operating requirements for the apparatus. For example, depending on the type of plasma application, the materials used in the apparatus may have extreme requirements in terms of chemical, mechanical, electrical, and thermal properties. The problem of meeting the materials requirements is further aggravated by the need to use materials that are preferably readily available and economical. Still further difficulties are imposed by the preference to operate the apparatus using commonly available industrial facilities and the desire for equipment that is simple in operation and reliable under a variety of conditions.

One frequently encountered problem is the need to remove heat generated by the plasma. This is a particularly challenging problem when the materials exposed to the plasma are dielectric materials. Typically, the dielectric materials used in plasma equipment are selected because the materials are substantially transparent to electromagnetic radiation such as RF power and/or because of the chemical or thermal stability of the material. The dielectric materials tend to have poor thermal conductivity. Furthermore, commonly used methods for cooling the dielectric materials frequently employ materials, such as metals, that have very high thermal conductivity compared to that for dielectrics. The differences in the thermal conductivity for dielectric and thermal conductivity for cooling materials can produce large thermal gradients in the dielectric material. The thermal gradients in the dielectric material along with the thermal expansion properties of the dielectric can produce physical stresses in the dielectric that can cause failures such as breakage of the dielectric. These failures can cause a loss in productivity and an increase in operating costs for plasma processing.

In addition to the need for moderating the temperature gradients in the dielectric material, there is also a need for maintaining the temperatures of the materials exposed to the plasma at suitable temperatures to prevent corrosion. This is particularly important when the plasma process uses reactive or corrosive gases. Specifically, the heat produced by the plasma must be removed and the surfaces exposed to the plasma must be maintained at temperatures at which corrosion is not a problem.

An additional problem for plasma processing occurs when changes in the plasma processing conditions cause the plasma to change its distribution in the plasma chamber. These changes can rapidly alter the heat flux from the plasma and produce new temperature gradients in dielectric materials exposed to the plasma. The rapid changes in temperature gradients can contribute to stresses that can cause the dielectric materials to break.

Some of the problems related to heat removal for plasma processing could be alleviated by using additional temperature controllers, additional temperature control systems, non-standard materials, and non-standard process facilities for process cooling. However, those choices lead to greater complexity for the system, greater initial cost, and greater operating cost.

Clearly, there are numerous applications requiring plasma processing systems. Unfortunately, typical methods and apparatus for old-style plasma processing systems have characteristics that may be undesirable for some applications. There is a need for plasma processing methods and apparatus that are simple in operation, use standard industrial facilities, provide high reliability, and have the versatility to handle a wide range of plasma conditions.

SUMMARY

This invention seeks to provide methods and apparatus that can overcome deficiencies of known plasma processing systems. Practicing this invention makes it possible to use plasma processing equipment having dielectric parts exposed to the plasma while achieving highly reliable operation with simple equipment that can use standard industrial process facilities.

Aspects of the present invention are accomplished using a plasma chamber, a heat moderating material, and a cooling instrument. It is an aspect of the present invention to use a heat moderating material to allow effective heat transfer through dielectric parts of the plasma chamber so as to minimize thermal stress induced breakage of the dielectric materials and prevent corrosion. The heat moderating material performs at least one of two functions.

A first function for the heat moderating material includes preventing direct contact between the dielectric material and the cooling instrument. The heat moderating material contacts the dielectric and contacts the cooling instrument. The heat moderating material has an effective thermal conductivity and an effective thickness so that in the presence of a heat flux there is a substantial temperature difference across the thickness of the heat moderating material such that the dielectric maintains temperatures and temperature gradients that result in negligible corrosion and reduce thermal stress induced breakage of the dielectric.

A second function for the heat moderating material includes functioning as a heat spreader. Heat spreaders are well known in heat transfer applications such as integrated circuit cooling and circuit board cooling. As an aspect of the present invention, the heat moderating material functions as a heat spreader to increase the effective area for heat transfer from the dielectric to the cooling instrument. The heat moderating material contacts the cooling instrument and contacts the surface of the dielectric material. Typically, the area of contact between the dielectric material and heat moderating material is greater than the area of contact for the cooling instrument. In addition to increasing the effective area for heat transfer, the heat spreader function of the heat moderating material also produces more uniform temperatures, i.e. less temperature variation, along the surface of the dielectric. The increased temperature uniformity produced by the heat moderator, when acting as a heat spreader, helps to reduce breakage of the dielectric.

A further aspect of the invention is to use a heat moderating material on dielectric parts of a plasma chamber wherein the heat moderating material is substantially transparent to RF power used for plasma processing.

An embodiment of the present invention includes a plasma chamber, a heat moderating material, and a cooling instrument having a cooling surface. The plasma chamber has one or more surfaces that define a volume for containing a plasma, and at least one of the surfaces includes a dielectric material. The dielectric material has a first side facing the plasma and a second side facing away from the plasma. The heat moderating material contacts the dielectric material at the second side facing away from the plasma. The cooling instrument contacts the heat moderating material such that the cooling surface does not directly contact the dielectric material. The heat moderating material has a thermal conductivity less than the thermal conductivity of the material of the cooling instrument surface that contacts the heat moderating material. Specifically, the heat moderating material has a thermal conductivity that produces a temperature gradient across the thickness of the heat moderating material when there is a heat flux from the plasma to the cooling instrument. The temperature gradient across the heat moderating material maintains the second side of the dielectric material facing away from the plasma at a temperature substantially higher than that of the cooling instrument surface. The heat moderating material moderates the heat transfer between the dielectric and the cooling instrument to provide a temperature gradient through the dielectric material that minimizes failures such as thermal stress induced breakage of the dielectric material. Furthermore, the heat moderating material moderates the heat transfer between the dielectric and the cooling instrument to maintain the first side of the dielectric facing the plasma at a temperature that results in negligible corrosion to the dielectric. Specifically, the dielectric surface exposed to the plasma must be kept cool enough to prevent excessive corrosion.

Another embodiment of the present invention includes using a plasma chamber, a heat moderating material, and a cooling instrument. The plasma chamber has one or more surfaces that define a volume for containing a plasma, and at least one of the surfaces includes a dielectric material. The heat moderating material contacts the surface of the dielectric. In one embodiment, the cooling instrument may have a plurality of cooling surfaces that define areas that are noncooling such as open areas or gaps. The cooling surfaces of the cooling instrument contacts the heat moderating material. Preferably, the area of the heat moderating material contacting the dielectric is greater than the area of the cooling surfaces of the cooling instrument contacting the heat moderating material. Preferably, the heat moderating material has a thermal conductivity greater than the thermal conductivity of the dielectric. Specifically, the heat moderating material has a thermal conductivity that allows the heat moderating material to function as a heat spreader to increase the area for removing heat from the ceramic to the cooling instrument such that there is a temperature gradient across the noncooling areas that reduces thermal stresses in the dielectric. The heat spreader function of the heat moderating material maintains the surface of the dielectric at a cooler and a more uniform temperature than is achieved without the heat spreader.

Another embodiment of the invention includes using the plasma chamber as described above, the cooling instrument, substantially as described above, and a heat moderating material wherein the heat moderating material produces a substantial temperature difference between the dielectric material and the cooling surface of the cooling instrument in the presence of the heat transfer from the plasma to the cooling instrument and wherein the heat moderating material also functions as a heat spreader.

Another embodiment of the present invention is a plasma source. The plasma source includes a chamber having at least one surface made of a dielectric material. The chamber is capable of containing an ionizable gas that can be excited to produce a plasma. The plasma source also includes an RF power source that is disposed to apply RF power to the chamber to ignite and sustain the plasma. The plasma source further includes a heat moderating material and a cooling instrument. The cooling instrument has at least one cooling surface. The heat moderating material is positioned between the dielectric material of the plasma chamber and the cooling surface of the cooling instrument. The heat moderating material contacts the dielectric material and the cooling surface. The heat moderating material prevents direct contact between the cooling surface of the cooling instrument and the dielectric material of the chamber. The cooling instrument removes heat generated by the plasma after the heat has passed through the dielectric material and through the heat moderating material. The heat moderating material has a thermal conductivity and a thickness that allow the cooling instrument to remove heat generated by the plasma at a heat flux that minimizes chamber breakage and chamber corrosion.

The cooling instrument can be of any form suitable for cooling. Example embodiments of the cooling instrument include cooling jackets, cooling coils, cold packs, heat pipes, and thermoelectric coolers. In preferred embodiments, the cooling instrument comprises metal tubing capable of flowing coolant. A more preferred embodiment is a coil made of an electrically conductive metal so that the cooling coil can be used as an RF power coupling element for coupling RF power into the plasma chamber. Preferred coil shapes include cylindrical coils, planar coils, and non-planar coils. Examples of preferred coil materials include copper, copper alloys, aluminum, aluminum alloys, and other materials with similar electrical conductivities and thermal conductivities.

Another embodiment of the present invention includes an RF power plasma apparatus. The apparatus includes a plasma chamber capable of containing a plasma. The chamber has a least one RF power transparent dielectric material that can allow RF power to enter the chamber. The apparatus also includes an RF power induction coil for coupling RF power to the plasma and an RF power source capable of applying RF power to the RF power induction coil. The induction coil has a bore for transporting a coolant to allow the induction coil to operate as a cooling instrument so as to remove heat produced by the plasma. The apparatus further includes a heat moderating material separating the induction coil and the dielectric material for moderating heat transfer from the dielectric material to the coil. The heat moderating material contacts the dielectric material and the coil. When operating, the heat produced by the plasma is removed by a coolant flow through the induction coil. The heat moderating material causes the dielectric material to maintain temperatures and temperature gradients that result in negligible corrosion and minimum thermal stress induced breakage of the dielectric.

When the cooling instrument uses a coolant, the preferred embodiment is to use coolant and coolant temperatures that are compatible with standard industrial process facilities such as the cooling water available in such facilities. Preferably, the coolant has temperatures between about 0° C. and about 100° C. More preferably, the coolant temperatures are between about 5° C. and about 50° C., including all subranges subsumed therein. A preferred coolant is water available at standard process facility cooling water temperatures.

The preferred heat transfer coefficients and thicknesses for the heat moderating material depend on whether the heat moderating material performs the first function, the second function, or both functions, as described above. The preferred heat transfer coefficient for the heat moderating material for performing the first function is a heat transfer coefficient less than that of the cooling surface material of the cooling instrument. The preferred heat transfer coefficient for the heat moderating material used for performing the second function is the highest heat transfer coefficient available for the heat moderating material. If the heat moderating material must perform both the first function and the second function, then the preferred heat transfer coefficient is a heat transfer coefficient less than that of the cooling surface material of the cooling instrument.

As an alternative embodiment, the heat moderating material can be composed of multiple layers of materials having different thermal conductivity such that a combination of the layers produces the required thermal properties for the heat moderating material. For example, one technique to optimize the heat moderating material to perform both the first function and the second function is to use a heat moderating material having two layers. The first layer is selected to have a high thermal conductivity to maximize the function as a heat spreader. The second layer is selected to have a lower thermal conductivity to produce the necessary temperature difference between the dielectric and the cooling surface.

Another embodiment for the heat moderating material is to include a spacer in the heat moderating material to ensure that the cooling instrument does not directly contact the dielectric. Preferably, the spacer would have a low thermal conductivity when used in situations that require the heat moderating material to perform the first function.

Preferably, the thickness of the heat moderating material and the thermal conductivity of the heat moderating material are selected to produce a maximum temperature for the dielectric material that is less than about 500° C. during steady-state practice of the invention. More preferably, the maximum temperature for the dielectric material is in the range from about 50° C. to about 300° C., including all ranges subsumed therein. Note, the inclusion of preferred operating temperatures is not to be interpreted as an operating limitation for the present invention. The operating temperatures are primarily dictated by the materials being used and the particular application.

The dielectric material described above can be of any type in standard use in plasma technology or any new dielectric materials that may be put into use for plasma technology. Examples of suitable dielectric materials are ceramics, composites, and polymers.

The RF power source may be any RF power source that can be used for igniting and sustaining a plasma. Any frequency of RF power suitable for igniting and sustaining the plasma is usable. Suitable frequencies include kHz frequencies, MHz frequencies, microwave frequencies, and beyond. Preferably, the RF power is coupled into the plasma chamber through the dielectric material. The RF power may be delivered to the plasma chamber using RF power coupling elements such as RF power induction coils, electrodes, antennas, and waveguides.

In various separate embodiments of the present invention, the plasmas generated using the methods and apparatus of the present invention may be used for different applications. Exemplary functions of the plasmas for various applications are as follows. The plasma can be a non-thermal plasma such as those used for chemical processing or materials processing. The plasma can be non-thermal plasmas such as those used for semiconductor device fabrication for etching, deposition, cleaning, doping, oxidation, drying, photo resist stripping, parts cleaning, reaction chamber cleaning, annealing, or any material processing. The plasma can be used for stimulating chemical reactions that cannot proceed or proceed slowly under non-plasma conditions. The plasma can be used for decomposing chemical compounds. The plasma can be used for synthesizing chemical compounds.

In another embodiment, the methods and apparatus of the present invention are be used for the treatment of gaseous halogenated organic compounds, other refractory organic compounds, perfluorocompounds, and refractory inorganic compounds. The apparatus includes a non-thermal plasma reactor that uses RF power for generating free radicals in a dielectric reaction vessel. In a further aspect of the present invention, the treatment of gases can be enhanced by the addition of suitable ancillary reaction gases including water, methane, hydrogen, ammonia, hydrogen peroxide, oxygen, or mixtures thereof.

Another embodiment of the present invention provides non-thermal plasma processing using an apparatus comprising commonly available materials and commonly available industrial facilities such as standard process cooling water or house cooling water.

Another embodiment of the present invention provides methods and apparatus for generating plasmas for promoting chemical reactions.

Another embodiment of the present invention provides methods and apparatus for RF power delivery for generation of plasmas for semiconductor device fabrication steps such as etching, deposition, cleaning, doping, oxidation, drying, photoresist stripping, parts cleaning, reaction chamber cleaning, and annealing.

Another embodiment of the present invention provides methods and apparatus for removal of refractory compounds from waste streams. Refractory compounds include compounds that show a high degree of stability with respect to temperature and reactivity and are difficult to decompose.

Another embodiment of the present invention provides new and useful methods and apparatus for the destruction of refractory compounds such as perfluorocompounds, such as carbon fluorides, carbon tetrafluoride, nitrogen triflouride, and sulfur hexafluoride by reactions facilitated by a plasma.

A further embodiment of the present invention provides methods and apparatus suitable for processing waste streams emanating from an individual semiconductor process tool and that can become an integral part of the semiconductor device fabrication process.

An advantage of embodiments of the present invention is the ability to provide waste treatment of undiluted off gases from individual semiconductor device fabrication tools. Embodiments of the present invention can be made compact enough to be integrated into and attached directly to one or more than one wafer processing tools.

The above and still further features and advantages of the present invention will become apparent upon consideration of the following detailed descriptions of specific embodiments thereof, especially when taken in conjunction with the accompanying drawings.

DESCRIPTION

Figure 1:
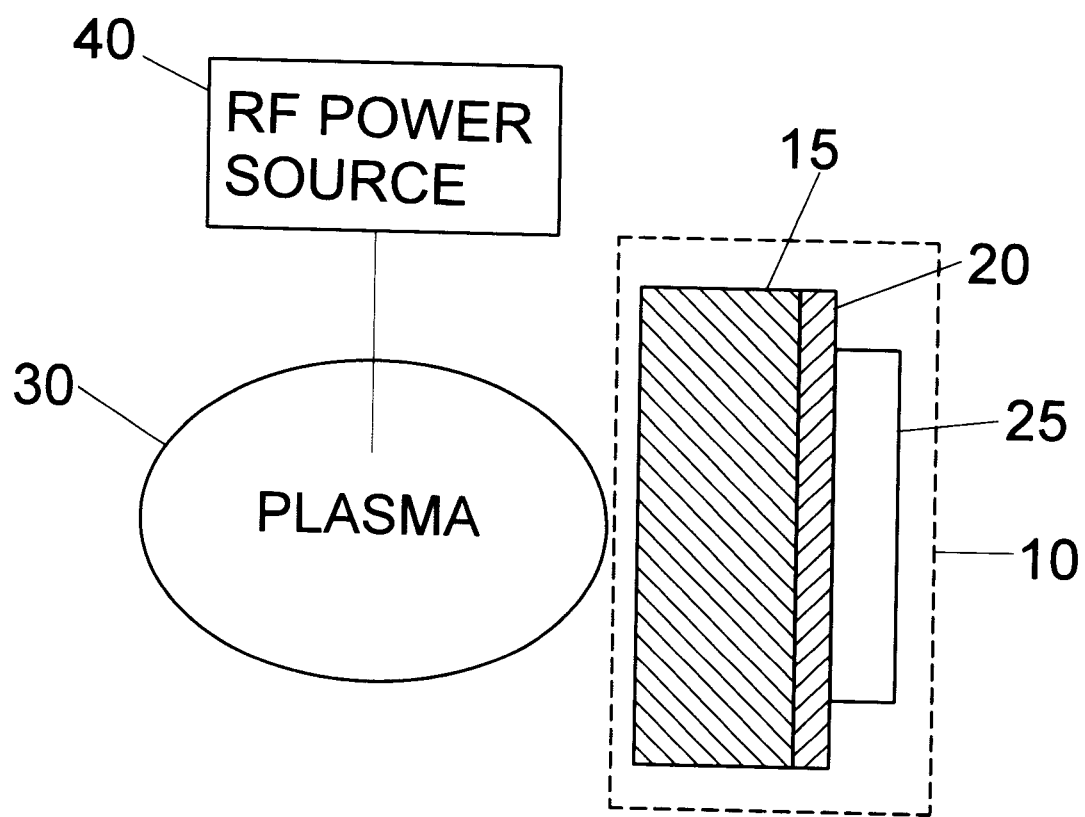
FIG. 1 is a schematic diagram of a first embodiment of the present invention.

Reference is now made to FIG. 1 wherein there is illustrated one embodiment of the present invention as a plasma processing apparatus section 10. The plasma processing apparatus section 10 includes a dielectric material 15, a heat moderating material 20, and a cooling instrument 25. The heat moderating material 20 contacts the dielectric material 15. The heat moderating material 20 also contacts the cooling instrument 25. Exposing the plasma processing apparatus section 10 to a plasma 30 causes heat from the plasma to enter the dielectric material 15. The dielectric material 15 transfers the heat to the heat moderating material 20. The heat moderating material 20 transfers the heat to the cooling instrument 25. The heat moderating material 20 has an effective thermal conductivity and effective thicknesses that cause the dielectric material 20 to achieve and maintain temperatures and temperature gradients that result in negligible corrosion and minimum breakage of the dielectric.

The heat transfer coefficients and the thicknesses for the heat moderating material 20 are selected to allow the heat moderating material to perform at least one of two functions. The first function for the heat moderating material 20 includes preventing direct contact between the dielectric material 15 and the cooling instrument 25. The thermal conductivity and the thicknesses for the heat moderating material 20 are selected so that in the presence of a heat flux from the plasma 30 there is a substantial temperature difference across the thickness of the heat moderating material 20 such that the dielectric material 15 maintains temperatures and temperature gradients that result in negligible corrosion and minimum thermal stress induced breakage of the dielectric. The substantial temperature difference is interpreted here to mean a temperature difference of at least about 1° C. For one embodiment of the present invention, a preferred range for the substantial temperature difference is from about 1° C. to about 200° C., including all temperatures subsumed therein.

The second function for the heat moderating material 20 includes performing as a heat spreader. Heat spreaders are well known in heat transfer applications; example technologies that widely use heat spreaders to facilitate cooling include semiconductor device cooling and circuit board cooling. Typically, heat spreaders are materials with higher thermal conductivities than the materials being cooled. Examples of materials that have good heat spreading properties because of their thermal conductivities are diamond, polycrystalline diamond, gold, copper, and aluminum. For the best heat spreading results for embodiments of present invention, the heat moderating material 20 has a thermal conductivity greater than the thermal conductivity of the dielectric material 15. The heat moderating material 20 functions as a heat spreader to increase the effective area for heat transfer from the dielectric material 15 to the cooling instrument 25. The heat moderating material 20 contacts the cooling instrument 25 and contacts the surface of the dielectric material 15. The area of contact between the dielectric material 15 and heat moderating material 20 is greater than the area of contact for the cooling instrument 25. In addition to increasing the effective area for heat transfer, the heat spreader function of the heat moderating material 20 also produces more uniform temperatures, i.e. less temperature variation, along the surface of the dielectric material 15. The increased uniformity of the temperature produced by the heat moderating material 20, when acting as a heat spreader, helps to minimize breakage of the dielectric material 15.

The preferred heat transfer coefficients and thicknesses for the heat moderating material 20 depend on whether the heat moderating material performs the first function, the second function, or both functions, as described above. The preferred heat transfer coefficient for the heat moderating material 20 for performing the first function is a heat transfer coefficient less than that of the material of the cooling surface of the cooling instrument 25. The preferred heat transfer coefficient for the heat moderating material 20 used for performing the second function is the highest heat transfer coefficient available for the heat moderating material 20. If the heat moderating material 20 must perform both the first function and the second function, then the preferred heat transfer coefficient is a heat transfer coefficient less than that of the material of the cooling surface of cooling instrument 25.

Preferably, the thicknesses of the heat moderating material 20 and the thermal conductivity of the heat moderating material 20 are selected to produce a maximum temperature for the dielectric material 15 that is less than about 500° C. during steady-state operation of the invention. More preferably, the maximum temperature for the dielectric material 15 is in the range of about 50° C. to about 300° C., including all ranges subsumed therein. Note, the inclusion of preferred operating temperatures is not to be interpreted as a limitation for the operation of the present invention; other operating temperatures can be used in practicing the present invention. The operating temperatures are primarily dictated by the materials being used and the particular application.

A preferred embodiment of the invention uses a heat moderating material on dielectric parts of a plasma chamber wherein the heat moderating material is substantially transparent to RF power used for plasma processing. Examples of thermally conductive materials that can meet these requirements include ceramics such as silicon carbide and silicon nitride; epoxy compounds such as aliphatic polyamine; polymers such as polyimide; diamond-like materials such as deposited diamond-like carbon; and diamond such as polycrystalline diamond suspended in a binder material.

The cooling instrument 25 can be of any form suitable for cooling. Example embodiments of the cooling instrument include cooling jackets, cooling coils, cold packs, heat pipes, and thermoelectric coolers. A preferred embodiment includes cooling coils capable of using standard process cooling water.

The dielectric material 15 can be any dielectric material in standard use in plasma technology or any new dielectric materials that may be put into use for plasma technology. Examples of suitable dielectric materials are ceramics, composites, and polymers. Example ceramics are alumina, magnesia, silica, carbides, nitrides, oxides, aluminum nitride, silicon nitride, sapphire, and mixtures or derivatives thereof.

Figure 2:
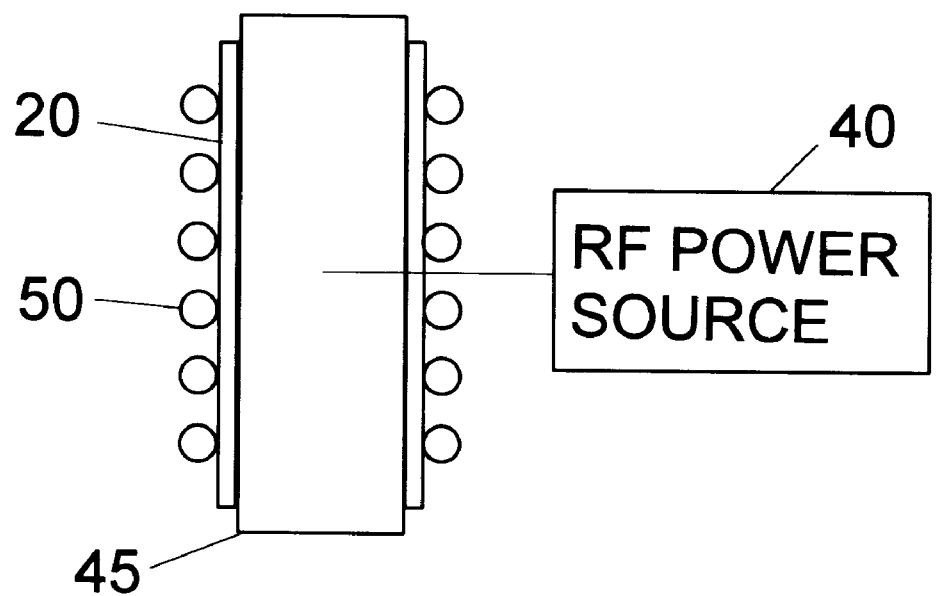
FIG. 2 is a schematic diagram of a second embodiment of the present invention.

Reference is now made to FIG. 2 of the drawings wherein the dielectric material is presented in the form of a plasma chamber 45. The plasma chamber 45 defines a volume for containing a plasma. The plasma chamber 45 is a tube that is capable of receiving gas and having the gas excited to generate the plasma. The RF power for the plasma is provided by RF power source 40. The heat moderating material 20 contacts the dielectric material of the plasma chamber 45. The cooling instrument is a cooling coil 50, shown in cross-section in FIG. 2, having multiple turns. The cooling coil 50 is a tube capable of carrying a coolant. The cooling coil 50 contacts the heat moderating material such that the cooling coil 50 does not directly contact the dielectric material of the plasma chamber 45. The heat moderating material 20 has a thermal conductivity less than the thermal conductivity of the cooling coil 50 contacting the heat moderating material 20. Specifically, the heat moderating material 20 has a thermal conductivity such that in the presence of a heat flux from the plasma to the cooling coil 50, there is a temperature gradient across the thickness of the heat moderating material 20. The temperature gradient across the heat moderating material 20 maintains the surface of the dielectric material of the plasma chamber 45 at a temperature substantially higher than the temperature of the cooling coil 50.

The heat moderating material 20 moderates the heat transfer between the plasma chamber 45 and the cooling coil 50 to produce temperature gradients through the plasma chamber 45 that minimize failures such as breakage of the plasma chamber 45 caused by thermal stresses from plasma processing. Furthermore, the heat moderating material 20 moderates the heat transfer between the plasma chamber 45 and the cooling coil 50 to maintain the plasma chamber 45 at a temperature that results in negligible corrosion to the plasma chamber 45 during plasma processing.

Figure 3:
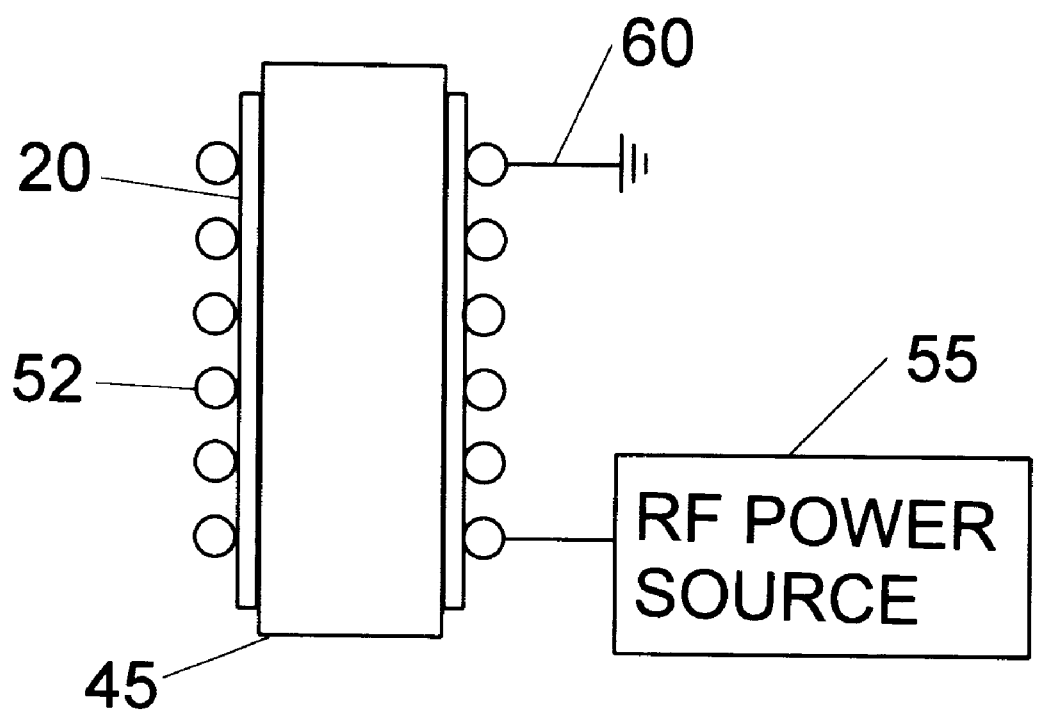
FIG. 3 is a schematic diagram of a third embodiment of the present invention.

Reference is now made to FIG. 3 of the drawings wherein the dielectric material is presented in the form of a plasma chamber 45. The plasma chamber 45 defines a volume for containing the plasma. The plasma chamber 45 is a tube that is capable of receiving gas and having the gas excited to generate the plasma. The heat moderating material 20 contacts the dielectric material of the plasma chamber 45. The cooling instrument is a cooling coil 52, shown in cross-section in FIG. 3, having multiple turns. The cooling coil 52 is an electrically conductive metal tube capable of carrying a coolant. The RF power for the plasma is provided by RF power source 55. The RF power source 55 is connected with the cooling coil 52, and an electrical ground connection 60 is made to the cooling coil 52 to allow the cooling coil 52 to perform as an RF power coupling element capable of inductively coupling RF power to the plasma chamber 45 to generate the plasma. The cooling coil 52 contacts the heat moderating material such that the cooling coil 52 does not directly contact the dielectric material of the plasma chamber 45. The heat moderating material 20 has a thermal conductivity less than the thermal conductivity of the cooling coil 52 contacting the heat moderating material 20. Specifically, the heat moderating material 20 has a thermal conductivity such that in the presence of a heat flux from the plasma to the cooling coil 50, there is a temperature gradient across the thickness of the heat moderating material 20. The temperature gradient across the heat moderating material 20 maintains the surface of the dielectric material of the plasma chamber 45 at a temperature substantially higher than the temperature of the cooling coil 52.

The heat moderating material 20 moderates the heat transfer between the plasma chamber 45 and the cooling coil 52 to provide temperature gradients through the plasma chamber 45 that minimizes failures such as breakage of the plasma chamber 45 caused by thermal stresses from plasma processing. Furthermore, the heat moderating material 20 moderates the heat transfer between the plasma chamber 45 and the cooling coil 52 to maintain the plasma chamber 45 at a temperature that results in negligible corrosion to the plasma chamber 45 during plasma processing.

Figure 4:
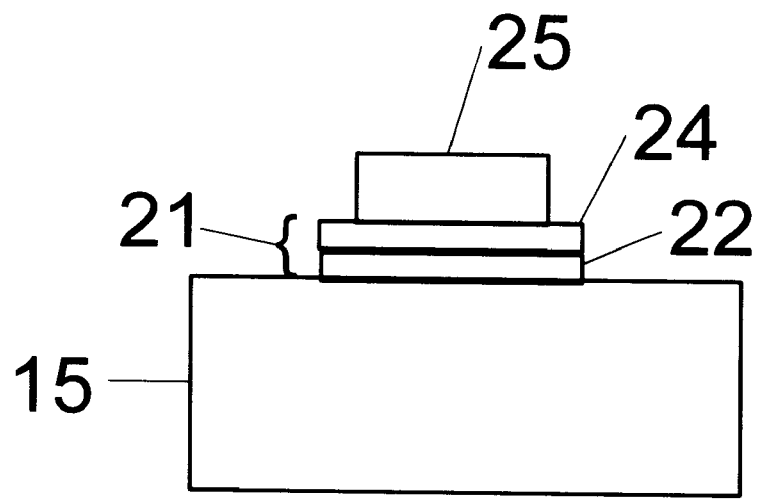
FIG. 4 is a schematic diagram of a fourth embodiment of the present invention.

Reference is now made to FIG. 4 wherein another embodiment of the present invention is shown. The dielectric material 15 is shown in contact with a heat moderating material 21. The heat moderating material 21 has two layers, a first layer 22 and a second layer 24. The heat moderating material 21 contacts the cooling instrument 25. The two layers 22, 24 of the heat moderating material 21 have different thermal conductivity such that a combination of the layers produces the required thermal properties for the heat moderating material 21. For example, the performance of the heat moderating material 21 is optimized by selecting one of the two layers to have a high thermal conductivity to maximize the function of the heat moderating material 21 as a heat spreader. The other layer is selected to have a lower thermal conductivity to produce the necessary temperature difference between the dielectric material 15 and the cooling surface 25. Furthermore, the thicknesses for each of the two layers 22, 24 are suitably selected to optimize the performance of the heat moderating material 21.

Figure 5:
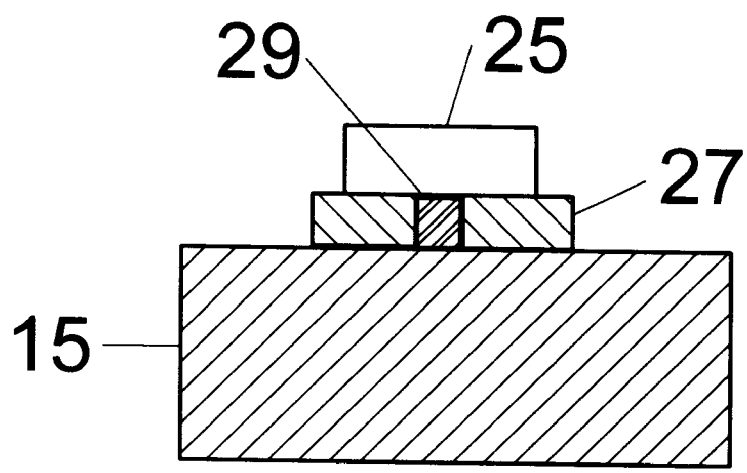
FIG. 5 is a schematic diagram of a fifth embodiment of the present invention.

Reference is now made to FIG. 5 showing another embodiment of the present invention. A heat moderating material 27 is shown wherein the heat moderating material includes spacer 29. The cooling instrument 25 contacts the heat moderating material 27. Spacer 29 is disposed to prevent direct contact between the cooling instrument 25 and the dielectric material 15. Preferably, the heat moderating material 20 contains a plurality of spacers 29. Preferably, the spacer has a low thermal conductivity when used in situations that require the heat moderating material 27 to maintain a substantial temperature difference between the dielectric material 15 and the cooling instrument 25 during plasma processing. Examples of suitable spacers are fibers of polymers and fibers of ceramics. Fiberglass and rock wool are examples of suitable ceramic fibers. Other examples of suitable spacers are ceramic particles and polymer particles.

If the heat moderating material primarily functions as a heat spreader, then it is allowable to have direct contact between the cooling surface and the dielectric. In other words, direct contact between the cooling surface and the dielectric is acceptable for embodiments of the present invention if the heat moderating material is only needed as a heat spreader. In addition, direct contact between the dielectric and the cooling surface is an applicable embodiment of the present invention if the thermal conductivity of the heat moderating material is greater than or equal to the thermal conductivity of the material making up the cooling surface.

A suitable range of thermal conductivities for the heat moderating material so as to produce an adequate temperature difference between the cooling surface and the dielectric depends on the materials that are being used, the dimensions of the materials, the temperature of the cooling surface, the plasma characteristics, and the heat flux from the plasma. For the materials typically used in plasma processing equipment, a suitable range of thermal conductivities is the range of about 0.1 W/m-K to about 418 W/m-K. A preferred range is the range of about 0.5 W/m-K to about 400 W/m-K. All thermal conductivity values and all subranges of thermal conductivity values falling within any of these stated ranges of thermal conductivity values are also included herein.

In one embodiment, the heat moderating material has a thermal conductivity of about 1.4 W/m-K; the heat moderating material is used in combination with a cooling surface containing a copper alloy. Suitable ceramics for this embodiment can have thermal conductivities in the range from about 10 W/m-K to about 50 W/m-K including all values subsumed therein.

If the heat moderating material functions primarily as a heat spreader, then the preferred thermal conductivity is the highest thermal conductivity available for the heat moderating material. The more preferred heat moderating material would have thermal conductivities like that of diamond and diamond-like carbon.

Suitable thicknesses of the heat moderating material depend upon the thermal conductivity of the heat moderating material. The heat transfer rate through the heat moderating material depends on the thermal conductivity and the thickness of the heat moderating material. Those two parameters of the heat moderating material are balanced in order to obtain satisfactory performance of the heat moderating material. Preferably, the heat moderating material has a thickness greater than about 1 micrometer. More preferably, the heat moderating material has a thickness greater than about 500 micrometers. Still more preferably, the heat moderating material has a thickness greater than about 1000 micrometers.

Various approaches can be taken in order to derive a suitable combination of thickness and thermal conductivity for the heat moderating material. For example, theoretical computer models can be used to model the heat transfer process and the resulting thermal stresses and temperature gradients occurring for different thermal conductivity and thickness for the heat moderating material. Alternatively, suitable thickness and thermal conductivity values can be derived by experimentally trying different values for thermal conductivity and thickness until the desired results for corrosion and breakage are obtained. Still another approach is to conduct experiments as part of a design of experiments program so as to derive models based on the experimental results. The model is then use to optimize the thickness and thermal conductivity for the heat moderating material.

Embodiments of the present invention can be used in a wide variety of plasma applications. The type of application for the embodiments of the present invention determines the required apparatus for the plasma chamber. For example, the plasma chamber must be capable of containing an ionizable gas at suitable pressure for generating the plasma. Plasma chambers of this type are well known in the art. Low-pressure plasma processing chambers, such as vacuum plasma processing chambers, are extensively used in applications such as plasma processes for electronic device fabrication.

Embodiments of the present invention are particularly suited for plasma processes for stimulating chemical reactions. Exemplary reactions include reactions for synthesizing chemical products, reactions for decomposing chemical compounds, and reactions for surface treatment. For this type of application, the plasma chamber includes capabilities for receiving and removing an ionizable gas, such as gas inlets and gas exits.

Embodiments of the present invention can be used to carry out plasma processing for which the plasma processing includes plasma treatment of a workpiece. Example workpieces include substrates such as semiconductor wafers that are subjected to plasma processes used in the fabrication of electronic devices and substrates subjected to plasma processes for fabrication of optical elements and devices. For applications of this type, the plasma chamber also includes methods and apparatus for positioning the workpieces during plasma processing.

Numerous commercially available RF power sources can be used in practicing embodiments of the present invention. A detailed description of the RF power source is not included here because RF power sources are well known in the art. Typical RF power sources suitable for practicing embodiments of the present invention include an RF power amplifier, an RF match, an RF power coupling element, sensors, and control systems for delivery of the RF power for plasma processing. The RF power amplifier can be any amplifier that produces RF power suitable for plasma processing. Suitable frequency ranges for the RF power include kHz, MHz, and GHz frequencies, in other words, any frequency for plasma processing throughout the radio frequency spectrum. The RF power coupling element is unnecessary for embodiments of the present invention in which the cooling instrument operates as an RF power coupling element.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. A method of plasma processing comprising the steps of:
   providing a plasma in a plasma chamber, the plasma chamber including a dielectric exposed to heat generated by the plasma, the dielectric having a surface;
   providing a cooling surface to remove heat from the dielectric surface; and
   providing a heat moderating material contacting the dielectric surface and contacting the cooling surface, the heat moderating material having thermal conductivities and thicknesses so as to perform at least one function of:
      a) producing a substantial temperature difference between the dielectric surface and the cooling surface and preventing direct contact between the dielectric surface and the cooling surface; and
      b) functioning as a heat spreader.

2. The method of claim 1 further comprising the step of providing a spacer in the heat moderating material to prevent direct contact between the cooling surface and the dielectric.

3. The method of claim 1 wherein the cooling surface is provided at a temperature between about 0° C. and about 50° C.

4. The method of claim 1 wherein the heat moderating material has a thermal conductivity less than the thermal conductivity of the material of the cooling surface and greater than about 0.1 W/m-K.

5. The method of claim 1 wherein the heat moderating material has a thermal conductivity greater than the thermal conductivity of the dielectric.

6. An apparatus for plasma processing comprising:
   a plasma chamber capable of containing a plasma, the plasma chamber having a section made of a dielectric, the dielectric having a surface;
   an RF power source disposed to apply RF power to sustain the plasma;
   a heat moderating material contacting the surface of the dielectric;
   a cooling instrument having a cooling surface for removing heat generated by the plasma, the cooling surface contacting the heat moderating material; wherein
   the heat moderating material has thermal conductivities and thicknesses that allow the cooling surface to remove heat from the dielectric so that the dielectric maintains temperatures that result in negligible corrosion to the dielectric and so that the dielectric maintains temperature gradients that minimize thermal stress induced breakage of the dielectric.

7. The apparatus of claim 6 wherein the heat moderating material has thermal conductivities and thicknesses so as to perform at least one of:
   a) producing a substantial temperature difference between the dielectric surface and the cooling surface and preventing direct contact between the dielectric surface and the cooling surface; and
   b) functioning as a heat spreader.

8. The apparatus of claim 6 wherein the heat moderating material prevents direct contact between the cooling surface and the dielectric surface.

9. The apparatus of claim 6 wherein the heat moderating material is substantially transparent to RF power used for plasma processing.

10. The method of claim 6 wherein the section comprising dielectric is a ceramic.

11. The apparatus of claim 6 wherein the cooling instrument includes a cooling coil that comprises a metal tube capable of transporting a coolant for cooling.

12. The apparatus of claim 11 wherein the dielectric is substantially transparent to RF power; the cooling coil is connected with the RF power source to receive RF power; and the cooling coil is configured to inductively couple RF power through the dielectric to sustain the plasma.

13. The apparatus of claim 6 wherein the cooling surface comprises copper.

14. The apparatus of claim 7 wherein the heat moderating material has a thermal conductivity less than about the thermal conductivity for the material of the cooling surface and greater than about 0.1 W/m-K.

15. The apparatus of claim 7 wherein the heat moderating material has a thermal conductivity greater than the thermal conductivity of the dielectric.

16. The apparatus of claim 7 wherein the heat moderating material comprises at least two layers of at least two materials having different thermal conductivities.

17. The apparatus of claim 7 wherein the heat moderating material includes a spacer to prevent direct contact between the cooling surface and the dielectric surface.

18. The apparatus of claim 7 wherein the heat moderating material has thermal conductivities in the range of about 0.1 W/m-K to about 400 W/m-K.

19. The apparatus of claim 7 wherein the heat moderating material has thermal conductivities in the range of about 0.5 W/m-K to about 20 W/m-K.

20. The apparatus of claim 7 wherein the heat moderating material comprises diamond or diamond-like carbon.

21. The apparatus of claim 7 wherein the heat moderating material comprises a thermally conductive epoxy.

22. The apparatus of claim 7 wherein the heat moderating material comprises a thermally conductive epoxy and a spacer.

* * * * *